(12) United States Patent
Yamanaka

(10) Patent No.: US 12,409,703 B2
(45) Date of Patent: Sep. 9, 2025

(54) AIR COOLING UNIT

(71) Applicant: TOYOTA JIDOSHA KABUSHIKI KAISHA, Toyota (JP)

(72) Inventor: Noriyuki Yamanaka, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 219 days.

(21) Appl. No.: 18/483,073

(22) Filed: Oct. 9, 2023

(65) Prior Publication Data
US 2024/0149638 A1   May 9, 2024

(30) Foreign Application Priority Data

Nov. 4, 2022  (JP) .................. 2022-177237

(51) Int. Cl.
*B60H 1/00* (2006.01)
*B60H 1/24* (2006.01)

(52) U.S. Cl.
CPC ......... *B60H 1/00821* (2013.01); *B60H 1/246* (2013.01)

(58) Field of Classification Search
CPC ...... B60H 1/00821; B60H 1/246; H05K 7/20; H05K 7/20245; H05K 7/20209
See application file for complete search history.

(56) References Cited

U.S. PATENT DOCUMENTS

| | | | |
|---|---|---|---|
| 6,912,128 B2* | 6/2005 | Bird | H01L 23/467 257/722 |
| 7,027,300 B2* | 4/2006 | Lord | H01L 23/467 361/709 |
| 2006/0087815 A1* | 4/2006 | Lanni | H05K 7/20209 361/695 |

FOREIGN PATENT DOCUMENTS

| | | |
|---|---|---|
| JP | 2015-211529 A | 11/2015 |
| JP | 2017-118616 A | 6/2017 |
| JP | 2020-78170 A | 5/2020 |

* cited by examiner

*Primary Examiner* — Marc E Norman
(74) *Attorney, Agent, or Firm* — Oblon, McClelland, Maier & Neustadt, L.L.P.

(57) ABSTRACT

An air cooling unit disclosed in the present specification includes an electrical apparatus, a duct having an outlet for blowing air along a surface of the electrical apparatus, a temperature sensor disposed in the electrical apparatus, and a controller configured to limit operation of the electrical apparatus when a temperature detected by the temperature sensor exceeds a threshold temperature. The inner surface of the air outlet has thereon a projecting portion. The projecting portion and the temperature sensor are located on a same straight line parallel to an air blowing direction at the air outlet when the projecting portion and the temperature sensor are viewed along a direction perpendicular to the surface of the electrical apparatus.

5 Claims, 4 Drawing Sheets

AIR COOLING UNIT

REFERENCE TO RELATED APPLICATIONS

This application claims priority to Japanese Patent Application No. 2022-177237, filed on Nov. 4, 2022, the entire contents of which are incorporated herein by reference.

BACKGROUND ART

A power converter described in Japanese Patent Application No. 2017-118616 includes a semiconductor element and a cooler including a fan configured to blow air for cooling the semiconductor element. The power converter continues operation of the fan of the cooler, for example, when an amount of decrease in a temperature of the semiconductor element is small. That is, the power converter controls the operation of the fan according to the temperature of the semiconductor element.

DESCRIPTION

Summary

A temperature sensor provided downstream of an air outlet is easily affected by an amount of air blown out from the air outlet (i.e., the amount of blown-out air). Specifically, when the amount of blown-out air is large, the temperature detected by the temperature sensor is low, and when the amount of blown-out air is small, the temperature detected by the temperature sensor is high. When the temperature detected by the temperature sensor varies depending on the amount of blown-out air, it becomes difficult to appropriately limit the operation of an electrical apparatus in accordance with the temperature detected by the temperature sensor. The present teachings provide, in an air cooling unit configured to limit the operation of an electrical apparatus in accordance with a temperature detected by a temperature sensor, a technique of suppressing the temperature sensor from being affected by the amount of blown-out air, by which the operation of the electrical apparatus can be appropriately limited.

An air cooling unit disclosed in the present specification may comprise an electrical apparatus, a duct having an air outlet configured to blowing air along a surface of the electrical apparatus, a temperature sensor disposed in the electrical apparatus, and a controller configured to control operation of the electrical apparatus when a temperature detected by the temperature sensor exceeds a threshold temperature. An inner surface of the air outlet may have thereon a projecting portion, and the projecting portion and the temperature sensor may be located on a same straight line parallel to an air blowing direction at the air outlet when the projecting portion and the temperature sensor are viewed along a direction perpendicular to the surface of the electrical apparatus.

In the air cooling unit described above, the projection portion is provided on the inner surface of the air outlet. The projecting portion disrupts air flow in the duct. Due to this, the amount of blown-out air is reduced downstream of the projecting portion. Further, the projecting portion and the temperature sensor, when viewed along the direction perpendicular to the surface of the electrical apparatus, are located on the same straight line parallel to the air blowing direction at the air outlet. That is, the temperature sensor is located downstream of the projecting portion in the air blowing direction. Due to this, it is difficult for the air blown out from the air outlet to reach the temperature sensor or its proximity. In other words, the flow rate of the air is stably reduced around the temperature sensor. Due to this, according to the air cooling unit disclosed herein, it is possible to suppress a temperature sensor from being affected by the amount of blown-out air. As a result of this, the air cooling unit can reliably limit operation of the electrical apparatus.

Details and further improvements of the technology disclosed herein are set forth in the Detailed Description below.

DETAILED DESCRIPTION

In an aspect of the present technology, the air outlet may have a cross-sectional shape which is flat along the surface of the electrical apparatus, and may have a first inner surface and a second inner surface that face each other. In this case, the first inner surface may have thereon a first projecting portion as at least a part of the projecting portion. According to such a configuration, the amount of blown-out air is prone to be uniform between the first inner surface and the second inner surface that face each other. Therefore, the amount of blown-out air at the first projecting portion is reliably reduced more than the amount of blown-out air at the other sites.

In an aspect of the present technology, the second inner surface may have thereon a second projecting portion facing the first projecting portion as at least a part of the projecting portion. According to such a configuration, the amount of projection of the first projecting portion can be reduced as compared with a configuration in which the projecting portion is formed only by the first projecting portion. As a result, manufacturing efficiency of the duct can be improved.

In an aspect of the present technology, a tip of the first projecting portion and a tip of the second projecting portion may be in contact with each other. According to such a configuration, the flow of air can be shut off between the tip of the first projecting portion and the tip of the second projecting portion. This can further reduce the amount of air blown out at the projecting portion.

In an aspect of the present technology, the surface of the electrical apparatus may have thereon a radiator having a plurality of fins extending along the air blowing direction. According to such a configuration, the air that has passed through the air outlet flows along the plurality of fins in the air blowing direction. Therefore, the air that has passed through the air outlet is further suppressed from flowing toward the downstream of the projecting portion. This makes it possible to more reliably reduce the flow rate of air around the temperature sensor.

Embodiment

Figure 1:
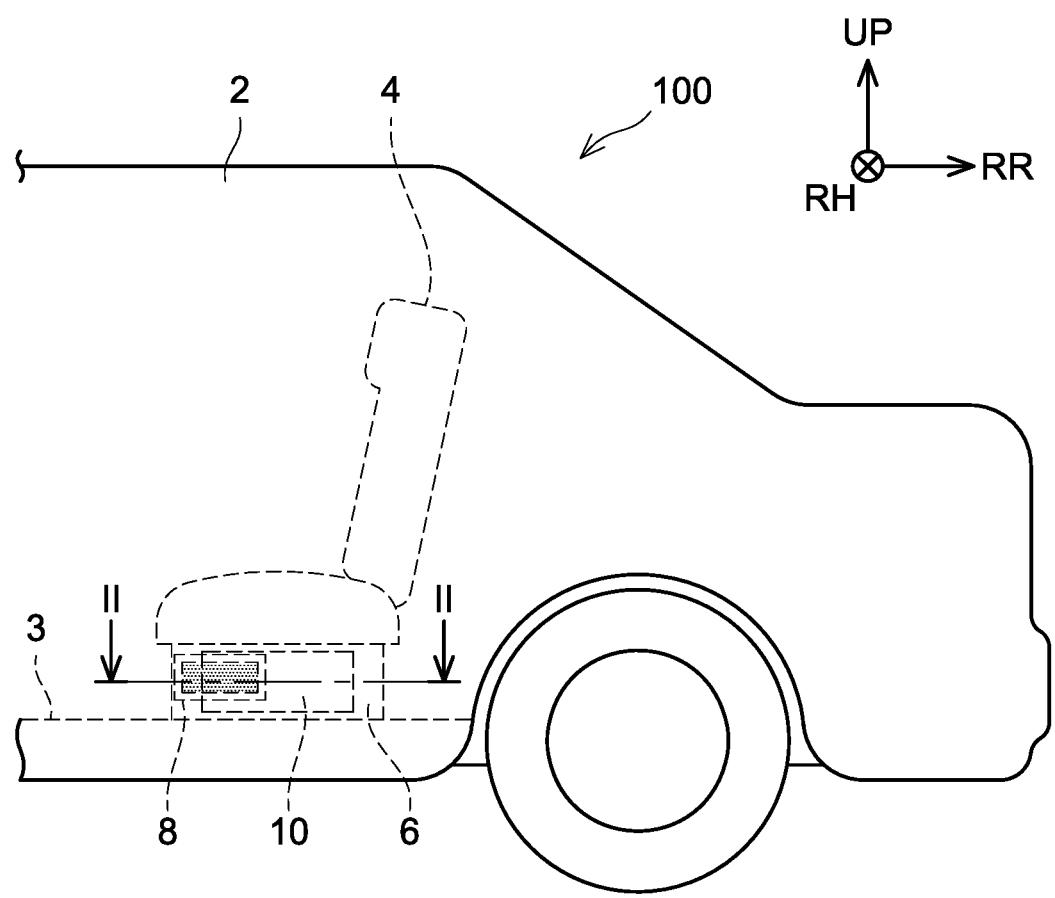
FIG. 1 shows a side view of an electric vehicle 100 in which an air cooling unit 10 according to an embodiment is mounted.

An air cooling unit according to an embodiment will be described with reference to drawings. FIG. 1 shows a side view of a rear part of an electric vehicle 100 in which an air cooling unit 10 according to an embodiment is mounted. The electric vehicle 100 comprises a floor 3, a rear seat 4, an under cover 6, and an air cooling unit 10 in a passenger compartment 2. The rear seat 4 is disposed on the floor 3. The rear seat 4 has a seating surface on which a passenger sits and a seatback extending upward from the seating surface. The under cover 6 is located below the rear seat 4. The under cover 6 is an interior component that covers (shields) structures such as the air cooling unit 10 disposed between the rear seat 4 and the floor 3 from inside of the passenger compartment 2. The under cover 6 has a grille 8. The grille 8 has a plurality of crosspieces arranged in a grid pattern, and communicates inside and outside of the under cover 6.

Figure 2:
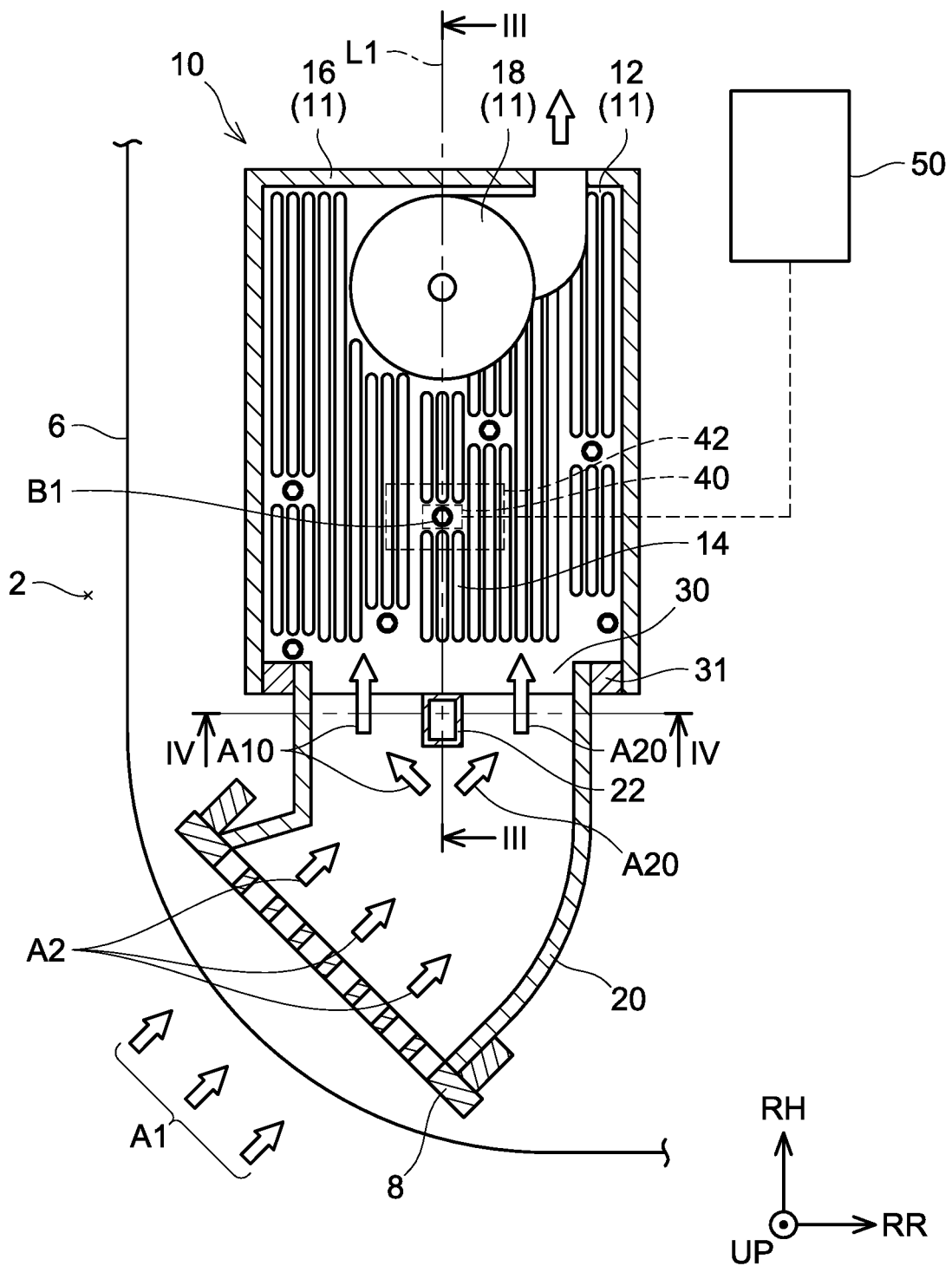
FIG. 2 shows a cross-sectional view along a line II of FIG. 1.
Figure 3:
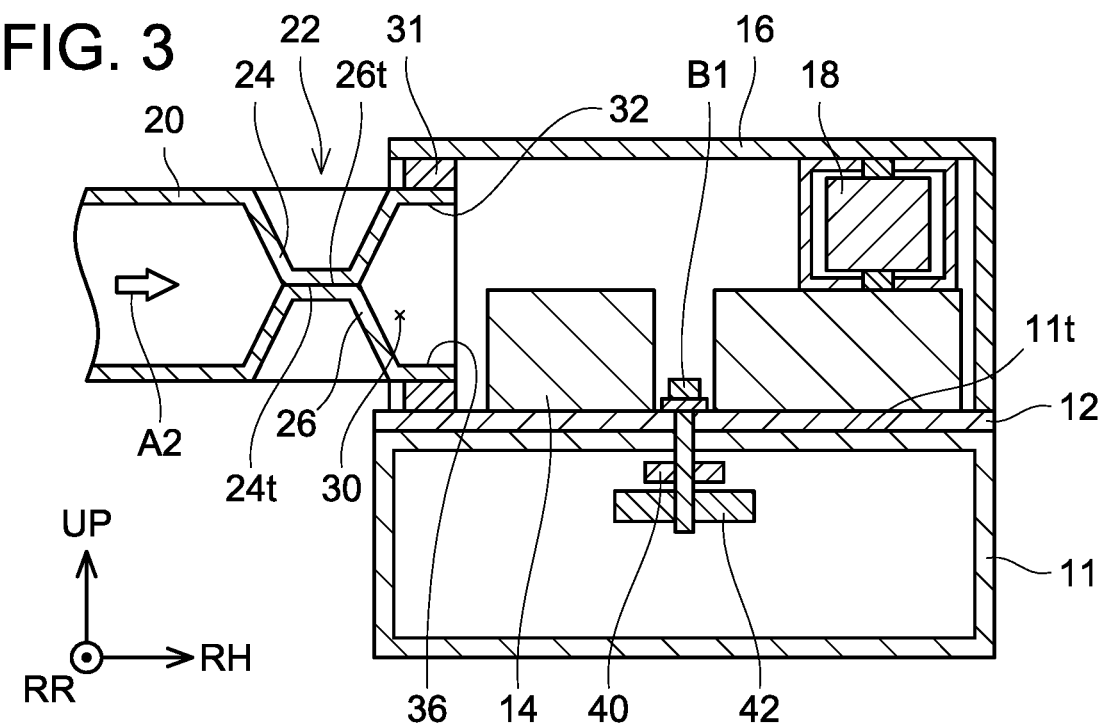
FIG. 3 shows a cross-sectional view along a line III of FIG. 2.
Figure 4:
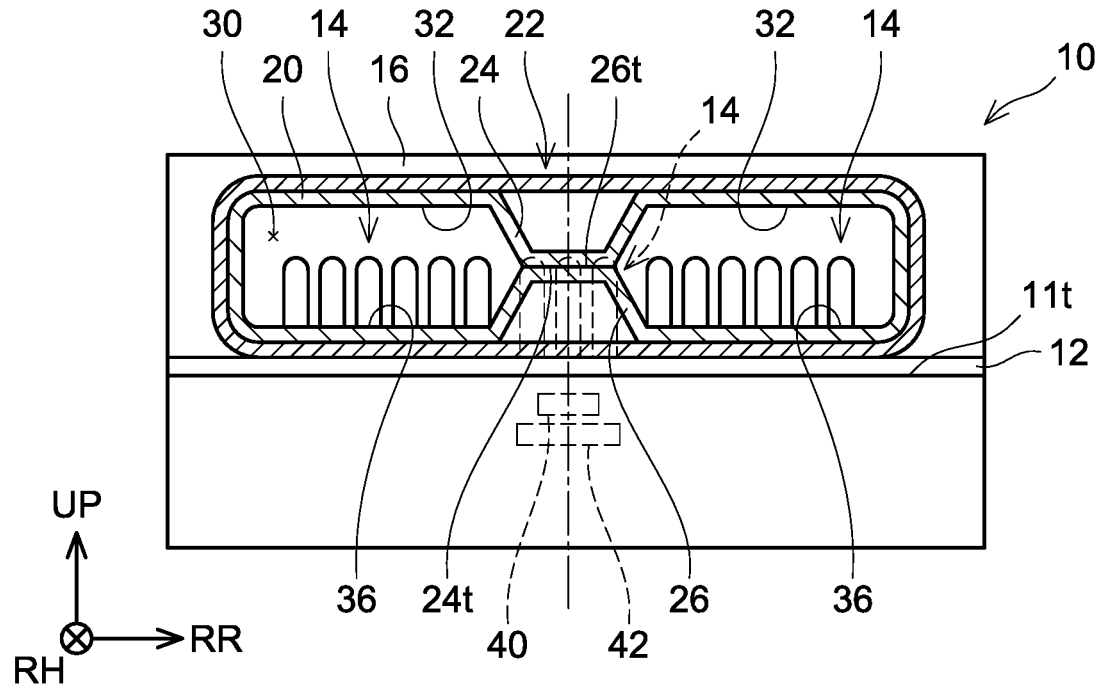
FIG. 4 shows a cross-sectional view along a line IV of FIG. 2.

A detailed structure of the air cooling unit 10 will be described with reference to FIGS. 2 to 4. FIG. 2 is a cross-sectional view taken along a line II-II of FIG. 1 and shows a plan view of the air cooling unit 10. FIG. 3 is a cross-sectional view taken along a line of FIG. 2, and FIG. 4 is a cross-sectional view taken along a line IV-IV of FIG. 2. Arrows UP, RH, and RR in the figure respectively indicate directions viewed from the passenger seated on the rear seat 4 of the electric vehicle 100. In the following description, a direction indicated by the arrow UP may be simply referred to as "upper", "upward", or "above" and a direction opposite thereto may be simply referred to as "lower", "downward", or "below". In addition, a direction indicated by the arrow RH may be simply referred to as "right" and a direction opposite thereto may be simply referred to as "left". A direction indicated by the arrow RR may be simply referred to as "rear", and a direction opposite thereto may be simply referred to as "front".

The air cooling unit 10 includes a charger 11, a duct 20, a temperature sensor 40, and a controller 50. The charger 11 is an in-vehicle box-shaped electrical apparatus configured to charge AC power from an AC power source such as a known household power source. As particularly shown in FIG. 3, the temperature sensor 40 and a semiconductor element 42 are disposed inside the charger 11. The temperature sensor 40 and the semiconductor element 42 are fixed to inside of the charger 11 by bolt(s) B 1. The temperature sensor 40 is located above the semiconductor element 42. Although not particularly limited, the semiconductor element 42 is an insulated gate bipolar transistor (IGBT). Although not shown, the charger 11 includes another elements in addition to the semiconductor element 42. Therefore, the charger 11 generates heat during its operation.

The charger 11 further includes a radiator 12, an upper cover 16, and a fan 18. As particularly shown in FIGS. 3 and 4, the radiator 12 is located on a surface 11*t* of the charger 11. The radiator 12 is a so-called heat sink and has a plurality of fins 14. As shown in FIG. 4, each of the fins 14 protrudes upward from an upper surface of a flat part of the radiator 12. As shown in FIG. 2, the plurality of fins 14 extends in a vehicle width direction (i.e., left-right direction). The upper cover 16 is a cover that covers the radiator 12 from above. In the present embodiment, the charger 11 is disposed along a horizontal direction of the electric vehicle 100. That is, FIG. 2, which is a plan view of the air cooling unit 10, shows a structure of the air cooling unit 10 as viewed along a direction perpendicular to the surface 11*t* of the charger 11.

The upper cover 16 and the grille 8 are connected by the duct 20. The duct 20 includes an outlet 30, a projecting portion 22, and a seal 31. As particularly shown in FIG. 2, the duct 20 communicates with the passenger compartment 2 via the grille 8. The duct 20 further communicates with a space between the upper cover 16 and the radiator 12 via the outlet 30. When the fan 18 operates, air is discharged from the space between the upper cover 16 and the radiator 12. As a result, the space between the upper cover 16 and the radiator 12 is put under negative pressure, and thus air A1 in the passenger compartment 2 is taken into the duct 20. Air A2 taken into the duct 20 is blown out along the radiator 12 through the outlet 30 of the duct 20.

The seal 31 seals between an outer peripheral surface of the duct 20 and an inner surface of the upper cover 16 as well as an upper surface of the radiator 12. As a result, the air A2 taken into the duct 20 is reliably blown out into the space between the upper cover 16 and the radiator 12.

Here, a detailed structure of the outlet 30 of the duct 20 will be described. As particularly shown in FIG. 4, the outlet 30 of the duct 20 has a flat cross-section along the surface 11*t* of the charger 11. Further, the outlet 30 has a first inner surface 32, and a second inner surface 36 located below the first inner surface 32. The first inner surface 32 and the second inner surface 36 face each other. That is, the outlet 30 of the duct 20 has a rectangular cross-sectional shape. Thus, a cross-sectional area of the outlet 30 is constant along a longitudinal direction of the outlet 30 (i.e., left-right direction). As a result, it is possible to make an amount of blown-out air from the outlet 30 substantially uniform along the longitudinal direction of the outlet 30.

Further, the first inner surface 32 has a first projecting portion 24 that projects downward toward the second inner surface 36. The first projecting portion 24 has a shape of a so-called truncated quadrangular pyramid and has four slopes and a first tip 24*t* connecting lower ends of the four slopes. The first tip 24*t* is a plane extending along the first inner surface 32 (i.e., in the horizontal direction).

The second inner surface 36 has a second projecting portion 26 that projects upward. The second projecting portion 26 faces the first projecting portion 24 and has a shape symmetrical to the first projecting portion 24 in the up-down direction. Thus, the second projecting portion 26 has a second tip 26*t* extending along the first tip 24*t*. By both the first projecting portion 24 and the second projecting portion 26 projecting, the projecting portion 22 is formed on the inner surfaces 32, 36 of the outlet 30. As a result, an amount of projection of the first projecting portion 24 can be reduced as compared with a configuration in which the projecting portion 22 is formed only by the first projecting portion 24. As a result, manufacturing efficiency of the duct 20 can be improved.

As shown in FIGS. 3 and 4, the first tip 24*t* of the first projecting portion 24 is in contact with the second tip 26*t* of the second projecting portion 26. Therefore, the flow of the air A2 is shut off between the first tip 24*t* and the second tip 26*t*. Consequently, as shown in FIG. 2, the air A2 in the duct 20 branches into air A10 and air A20. As such, the first tip 24*t* and the second tip 26*t* of the projecting portion 22 are in contact with each other, so that it is possible to reduce the amount of blown-out air downstream of the projecting portion 22.

The branched air A10, A20 are blown out along the plurality of fins 14 arranged in the radiator 12. Consequently, each of the blown-out air A10, A20 cools the radiator 12. As a result, the radiator 12 radiates the heat generated by the charger 11. Hereinafter, in the present teachings, a direction in which each of the air A10, A20 is blown out (that is, the left-right direction in the present embodiment) will be referred to as the "blowing direction". In the present embodiment, the blowing direction is a direction orthogonal to the outlet 30. That is, FIG. 3 is a cross-sectional view of the air cooling unit 10 along a plane defined by a straight line L1 parallel to the blowing direction and the direction perpendicular to the surface 11t of the charger 11.

The controller 50 is electrically connected to the charger 11 and the temperature sensor 40. The controller 50 is a device configured to control operation of the charger 11 according to a traveling state of the electric vehicle 100, for example. For example, the controller 50 limits the operation of the charger 11 according to the temperature received from the temperature sensor 40.

Figure 5:
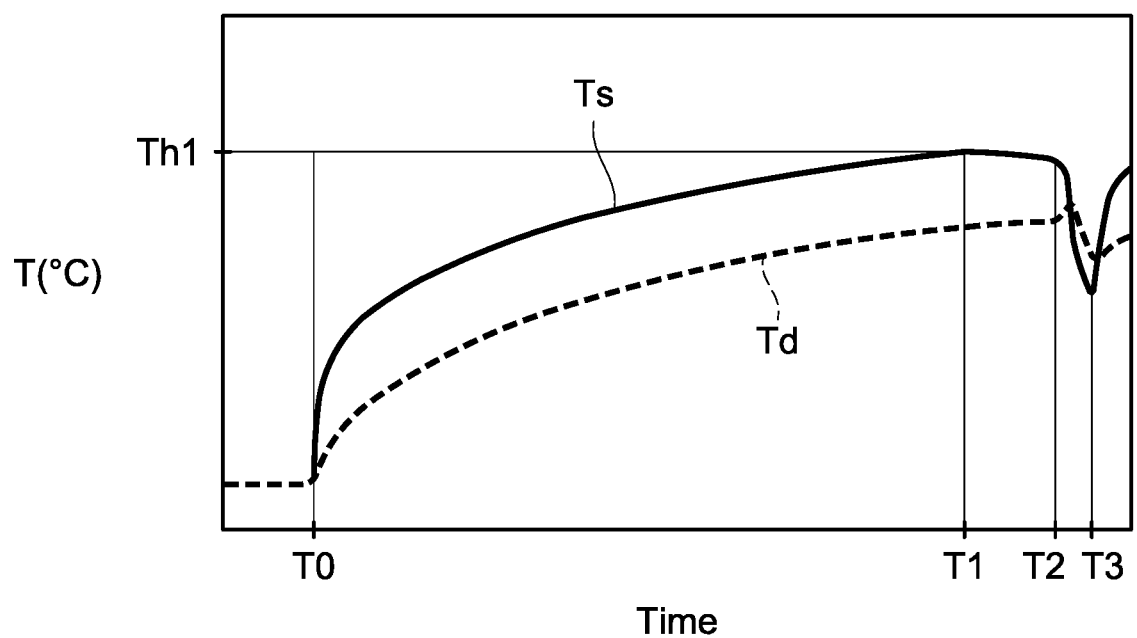
FIG. 5 is a graph showing temporal change in a detected temperature Ts of a temperature sensor 40.

Referring to FIG. 5, a temporal change of a temperature Ts (hereinafter, referred to as a detected temperature Ts) detected by the temperature sensor 40 in the air cooling unit 10 of the present embodiment will be described. In FIG. 5, a vertical axis represents the temperature, and a horizontal axis represents time.

The controller 50 already has a threshold temperature Th1 stored in its own memory. The threshold temperature Th1 is calculated by multiplying an upper limit of an allowable temperature at which the operation of the charger 11 is guaranteed by a predetermined safety factor. The threshold temperature Th1 is set based on charge capacitance of the charger 11, a number of elements included in the semiconductor element 42, and the like.

As shown in FIG. 5, when the charger 11 is activated at timing T0, the detected temperature Ts increases due to heat generation of the semiconductor element 42 and the like. When the operation of the charger 11 further continues, the detected temperature Ts exceeds the threshold temperature Th1 at timing T1. In this case, the controller 50 stops the operation of the charger 11 at the timing T1. Due to this, the heat generation of the semiconductor element 42 and the like is stopped, so that the detected temperature Ts gradually decreases and rapidly drops from timing T2. At timing T3, the controller 50 reactivates the charger 11 when the detected temperature Ts falls below a predetermined temperature. Due to this, the detected temperature Ts rises again. As such, the controller 50 stops the operation of the charger 11 when the detected temperature Ts exceeds the threshold temperature Th1. This prevents the temperature of the charger 11 from rising above the allowable temperature of the charger 11.

Here, a detected temperature Td in FIG. 5 indicates a temperature detected, not by the temperature sensor 40, but by a temperature sensor (hereinafter, referred to as another temperature sensor) arranged at a site offset in the front-rear direction from downstream of the projecting portion 22 of the charger 11. The detected temperature Td is lower than the detected temperature Ts of the temperature sensor 40. For example, the detected temperature Td has not reached the threshold temperature Th1 at the timing T1. This is because the air A10, A20 blown out along the blowing direction from the outlet 30 reaches surroundings of the other temperature sensor. In other words, this is because the flow rate of the air A10, A20 blown out to the surroundings of the other temperature sensor is large. Thus, the temperature detected by each of the temperature sensors is affected by the flow rate of the air A10, A20 from the outlet 30. That is, the temperature detected by the temperature sensors varies according to the flow rate of the air A10, A20.

If the projecting portion 22 is not provided at the outlet 30 of the duct 20 and the detected temperature Ts of the temperature sensor 40 changes according to the flow rate of the air A10, A20, the controller 50 may not be able to appropriately stop the operation of the charger 11. At the timing T1, the detected temperature Ts of the temperature sensor may be smaller than the threshold temperature Th1 due to the effects of the air A10, A20. In this case, since the controller 50 continues the operation of the charger 11 even though the actual temperature of the semiconductor element 42 exceeds the allowable temperature of the semiconductor element 42, the semiconductor element 42 may be damaged.

As shown in FIG. 2, in the air cooling unit 10 of the present embodiment, the projecting portion 22 and the temperature sensor 40 are located on the same straight line L1 that is parallel to the blowing direction of air A10, A20 at the outlet 30. That is, the temperature sensor 40 is located downstream of the projecting portion 22 in the blowing direction. Therefore, it is difficult for the air A10, A20 blown out from the outlet 30 along the blowing direction to reach the surroundings of the temperature sensor 40. That is, regardless of the flow rate of the air A10, A20, the flow rate of the air A10, A20 is stably reduced around the temperature sensor 40. Further, the radiator 12 includes the plurality of fins 14 extending along the blowing direction. The plurality of fins 14 lets the air A10, A20 blown out from the outlet 30 along the blowing direction flow along the blowing direction. Therefore, as compared with in a configuration not including the radiator 12 having the plurality of fins 14, it is more difficult for the air A10, A20 blown out along the blowing direction from the outlet 30 to reach the surroundings of the temperature sensor 40.

As described above, in the air cooling unit 10 of the present embodiment, by having the projecting portion 22 stably reduce the flow rate of the air A10, A20 around the temperature sensor 40, the temperature sensor 40 can be suppressed from being affected by the air A10, A20. As a result, since the controller 50 can appropriately restrict the operation of the charger 11, the charger 11 can be suppressed from being damaged.

While specific examples of the present disclosure have been described above in detail, these examples are merely illustrative and place no limitation on the scope of the patent claims. The technology described in the patent claims also encompasses various changes and modifications to the specific examples described above. Some of variants of the above embodiments will be listed as below.

(Modification 1) Although the charger 11 is an example of "electrical apparatus", the "electrical apparatus" may not be limited to the charger 11. For example, the electrical apparatus may be a DC/DC converter.

(Modification 2) The temperature sensor 40 may be integrated with the semiconductor element 42.

(Modification 3) The outlet 30 may not have a flat cross-sectional shape. For example, the outlet 30 may have a circular cross-sectional shape or an elliptical/oval/oblong cross-sectional shape.

(Modification 4) The projecting portion 22 may be formed only by the first projecting portion 24. In this case, the second projecting portion 26 may not be provided on the second inner surface 36.

(Modification 5) The first tip 24t of the first projecting portion 24 may not have to be in contact with the second tip 26t of the second projecting portion 26, and thus a gap may be provided therebetween.

The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. An air cooling unit comprising:
   an electrical apparatus,
   a duct having an air outlet configured to blow air along a surface of the electrical apparatus;
   a temperature sensor disposed in the electrical apparatus; and
   a controller configured to limit operation of the electrical apparatus when a temperature detected by the temperature sensor exceeds a threshold temperature,
   wherein
   an inner surface of the air outlet has thereon a projecting portion, and
   the projecting portion and the temperature sensor are located on a same straight line parallel to an air blowing direction at the air outlet when the projecting portion and the temperature sensor are viewed along a direction perpendicular to the surface of the electrical apparatus.

2. The air cooling unit according to claim 1, wherein
   the air outlet has a cross-sectional shape which is flat along the surface of the electrical apparatus, and has a first inner surface and a second inner surface that face each other, and
   the first inner surface has thereon a first projecting portion as at least a part of the projecting portion.

3. The air cooling unit according to claim 2, wherein
   the second inner surface has thereon a second projecting portion facing the first projecting portion, as at least a part of the projecting portion.

4. The air cooling unit according to claim 3, wherein
   a tip of the first projecting portion and a tip of the second projecting portion are in contact with each other.

5. The air cooling unit according to claim 4, wherein
   the surface of the electrical apparatus has thereon a radiator having a plurality of fins extending along the air blowing direction.

* * * * *